(12) United States Patent
Hasegawa

(10) Patent No.: US 7,841,862 B2
(45) Date of Patent: Nov. 30, 2010

(54) DIELECTRIC SHEET

(75) Inventor: Miki Hasegawa, Aichi (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 1332 days.

(21) Appl. No.: 10/547,003

(22) PCT Filed: Feb. 27, 2004

(86) PCT No.: PCT/JP2004/002591

§ 371 (c)(1),
(2), (4) Date: Feb. 8, 2006

(87) PCT Pub. No.: WO2004/077622

PCT Pub. Date: Sep. 10, 2004

(65) Prior Publication Data

US 2009/0078449 A1  Mar. 26, 2009

(30) Foreign Application Priority Data

Feb. 28, 2003  (JP) .............................. 2003-054778

(51) Int. Cl.
*H01R 1/00* (2006.01)

(52) U.S. Cl. .......................... 439/66; 439/91; 174/145; 174/137 R

(58) Field of Classification Search ................ 174/145, 174/137 R; 439/66, 91
See application file for complete search history.

(56) References Cited

U.S. PATENT DOCUMENTS

| 5,164,242 | A | * | 11/1992 | Webster et al. .............. 428/188 |
| 6,512,912 | B2 | * | 1/2003 | Kamei et al. ................. 399/313 |
| 6,689,288 | B2 | * | 2/2004 | St. Clair et al. .......... 252/62.9 R |
| 7,147,742 | B2 | * | 12/2006 | Kirsten ..................... 156/272.2 |
| 2002/0170748 | A1 | * | 11/2002 | Larson ........................ 174/260 |
| 2002/0173072 | A1 | * | 11/2002 | Larson ........................ 438/107 |
| 2004/0045161 | A1 | * | 3/2004 | Larson ......................... 29/832 |
| 2006/0250534 | A1 | * | 11/2006 | Kutscher et al. .............. 349/41 |
| 2006/0290237 | A1 | * | 12/2006 | Arbogast et al. ............ 310/331 |

FOREIGN PATENT DOCUMENTS

| JP | 04-109510 A | 4/1992 |
| JP | 06-005116 A | 1/1994 |
| JP | 06-020519 A | 1/1994 |
| JP | 06-97002 A | 4/1994 |

(Continued)

OTHER PUBLICATIONS

International Search Report mailed on Jun. 22, 2004.

*Primary Examiner*—Gary F. Paumen
(74) *Attorney, Agent, or Firm*—Rader, Fishman & Grauer PLLC

(57) ABSTRACT

To provide a dielectric sheet that can be used as an elastomer connector in order to connect highly integrated circuit board and fine pitch electronic parts. The dielectric sheet (10*f*) comprises a first penetrating region (222*c*) having high permittivity, and a second penetrating region (33*a*) having conductivity, the regions are arranged and formed in such a way that they are alternatively interspersed in longitudinal and crosswise directions in a non-conductive sheet-shaped elastomer. The transverse thickness W2 and longitudinal thickness W5 in the first penetrating region (222*c*) may be arbitrarily determined. Similarly, the transverse thickness W3 and longitudinal thickness W5 in the second penetrating region (33*a*) may be arbitrarily determined. The dielectric sheet (10*f*) serves to compliment the circuit of electronic parts (for example, the printing board) to be connected thereto.

16 Claims, 12 Drawing Sheets

FOREIGN PATENT DOCUMENTS

| | | |
|---|---|---|
| JP | 06-176624 A | 6/1994 |
| JP | 11-329075 A | 11/1999 |
| JP | 2000-207943 A | 7/2000 |
| JP | 2000-221209 A | 8/2000 |
| JP | 2000-340037 A | 12/2000 |
| JP | 2002-005991 A | 1/2002 |

* cited by examiner

DIELECTRIC SHEET

FIELD OF THE INVENTION

The present invention relates to a dielectric sheet disposed between circuit boards such as printed circuit boards and various circuit components.

RELATED ART

In recent years, more and more electronic devices have reduced their sizes and thickness and it has become dramatically desirable to implement a connection between small circuits or a connection between a small component and a small circuit. As examples of such connections, there may be solder joining or joining with anisotropic conductive adhesives. In another example, an anisotropic conductive elastomer sheet may be disposed between an electronic component and a circuit board for conduction of electricity therebetween.

The anisotropic conductive elastomer sheet herein is referred to as an elastomer sheet that has conductivity in a certain direction only. Some anisotropic conductive elastomer sheets exhibit conductivity only in a direction of thickness, and others exhibit conductivity in the direction of thickness only when pressed in the direction of thickness.

The anisotropic conductive elastomer sheets can achieve an electronic connection in a simple way without using soldering, mechanical fitting, or the like and also can achieve the connection to absorb mechanical impact and strain. Therefore, anisotropic conductive elastomer sheets are widely used in such fields as a liquid crystal display, a cellular phone, an electronic computer, an electronic digital clock, an electronic camera, a computer and the like.

The anisotropic conductive lastomer sheets are also widely used as electronic connectors for connecting a circuit apparatus such as a printed circuit board, and a leaderless chip carrier or a liquid crystal panel. An elastomer connector is a connector utilizing elastomer such as conductive rubber disposed between electrodes to obtain an electrical connection simply by pressing the electrodes. One of such types of elastomer connectors may include an anisotropic conductive elastomer sheet having properties of being insulative in a horizontal direction and conductive in a vertical direction.

In the testing of electrical connections of circuit apparatus such as printed circuit boards and semiconductor integrated circuits, a sheet of anisotropic conductive elastomer is interposed and makes an electrical connection between an electrode region to be tested which is formed on at least one surface of the circuit apparatus to be tested and an electrode region of the testing circuit board which is formed on at least one surface of the testing circuit board.

Conventionally, it is known that an anisotropic conductive block is firstly formed by integrating aligned metal wires by using insulator and the resultant block is then sliced in a direction perpendicular to the direction of the metal wire so as to make an anisotropic conductive elastomer sheet. (As an example, referring to Japanese Laid-Open Patent Publication No. 2000-340037)

The use of metal wire in the anisotropic conductive elastomer sheet, however, makes it difficult to shorten the distance between the wires, therefore it is not easy to surely obtain the fine pitch that is demanded for anisotropic conductivity in the highly integrated circuit boards and electrical components in recent years. Metal wires are susceptible to a compressive buckling and may be dropped off from the sheet when used repeatedly such that the anisotropic sheet may not fully conduct performance thereof.

Elastomer connectors, employed recently in the highly integrated high-density circuit board and in the fine pitch electrical components for the electrical connections, can secure an assembling space when the electrical elements are incorporated in the elastomer connectors.

The incorporation of the electrical element into the elastomer connectors for the testing of the electrical connections of the circuit apparatus such as printed circuit boards and semiconductor integrated circuits can improve the accuracy of measurement.

SUMMARY OF THE INVENTION

In view of the above, the present invention it is an object to provide a dielectric sheet used as an elastomer connector of today's highly integrated circuit board and fine pitch electrical components.

In order to satisfy the above objectives, inventors of the present invention invented a novel dielectric sheet below.

(1) A dielectric sheet comprising: at least one first penetrating region having high permittivity, the first penetrating region being formed in a non-conductive sheet-shaped elastomer.

(2) The dielectric sheet according to (1), wherein said at least one first penetrating region having high permittivity is interspersed on the non-conductive sheet-shaped elastomer.

(3) The dielectric sheet according to (1) or (2), wherein said at least one first penetrating region having high permittivity is arranged with regularity in the non-conductive sheet-shaped elastomer.

(4) The dielectric sheet according to any one of (1) to (3), further comprising: at least one second penetrating region having conductivity being formed in the non-conductive sheet-shaped elastomer.

(5) The dielectric sheet according to (4), wherein a same number of said at least one first penetrating region having high permittivity and said at least one second penetrating region having conductivity are formed in the non-conductive sheet-shaped elastomer.

(6) The dielectric sheet according to (4) or (5), wherein said at least one first penetrating region having the high permittivity and said at least one second penetrating region having conductivity are formed in pairs.

(7) The dielectric sheet according to any one of (4) to (8), wherein said at least one second penetrating region having conductivity intersperses in the non-conductive sheet-shaped elastomer.

(8) The dielectric sheet according to any one of (1) to (7), said at least one first penetrating region having high permittivity includes ferroelectrics.

(9) A pair of electronic parts comprising the pair of electronic parts are connected with each other by the dielectric sheet according to any one of (1) to (8).

The present invention may be characterized in that at least one first penetrating region having high permittivity is formed in a non-conductive sheet-shaped elastomer.

The "permittivity" referred herein may represent a relative permittivity. The permittivity differs according to the physical properties of the first penetrating region. In most cases, the first penetrating region has a higher permittivity than a sheet-shaped elastomer. The region having "high permittivity" represents a state in which the region has a higher permittivity than the adjacent region.

The first penetrating region having high permittivity may thus be formed with materials having high permittivity. The material that has high permittivity, for example, is ferroelectrics.

An example of ferroelectrics includes barium titanate (BaTiO3) that is an oxide of perovskite, lead titanate (PbTiO3), lithium niobate (LiNbO3) and lithium tantalite (LiTaO3). The first penetrating region may include any materials of above ferroelectrics in a shape of piece, particle, flake, or powder.

A "penetrating region" is formed to have predetermined areas on both front surface and back surface of the sheet-shaped elastomer and a thickness, that is, the region penetrates from the front surface to the back surface of the sheet-shaped elastomer), and may be considered that the region has a volume as an object. The penetrating region appearing on front or back surface of the sheet-shaped elastomer may be of circular or of any other shape.

The first penetrating region having high permittivity is formed of materials including high dielectric particles. The high dielectric particles in the first penetrating region may be distributed evenly or unevenly. Additionally, the high dielectric particle may be included in a region other than the first penetrating region. The number of high dielectric particles included in a dielectric sheet may change dramatically in a boundary between the first penetrating region and the sheet-shaped elastomer, or may decrease gradually from the first penetrating region toward a region that is formed of sheet-shaped elastomer.

The boundary in the first penetrating region may be, but not necessarily formed in a way that the region is able to be observed as required. In addition, the boundary in the first penetrating region may be specified by average content of high dielectric particle within a predetermined range from the center of the penetrating region.

In the case where the first penetrating region is of circular shape, the boundary is determined in a way mentioned below. The first penetrating region is sandwiched by aforementioned circular electrode such that the center of the circular electrode having a predetermined diameter is aligned with the first penetrating region, and then the capacitance in the first penetrating region is measured as a solid capacitor. The capacitance increases as the diameter of the circular electrode is made larger until it reaches to a point where the capacitance does not go beyond a fixed value even if the diameter of the circular electrode is still made larger. The diameter of the circular electrode with the capacitance remaining constant may thus be determined as a boundary of the first penetrating region. Alternatively, a specified value is firstly determined while the capacitance is still on the increase, and the boundary of the first penetrating region may be determined when the diameter of the circular electrode equals to the predetermined value. In the case where the first penetrating region is of rectangular shape, the boundary is determined in a similar way as above.

The term "non-conductive" herein refers to as a state wherein the conductivity is sufficiently low or the electric resistance is sufficiently high. On the other hand, for a sheet-shaped elastomer, as a whole, the term "non-conductive" should mean that the sheet have a non-conductivity that can provide sufficient non-conductivity in a non-conductive direction of a sheet that is of such arrangement. The electric resistance in this case is preferably no less than 10 kilo-ohms (kΩ), more preferably no less than 100 kilo-ohms (kΩ), and further preferably no less than 1 milliohm (mΩ).

The term "sheet-shaped" herein refers to as a flat plate of a generally considerable sheet shape. The plate may be of a circular or a rectangular shape. The thickness of the sheet-shaped elastomer plate, however, should be thin and even as possible.

Non-conductive sheet-shaped elastomer may be an elastomer sheet formed with elastomer materials having no conductivity in a shape of sheet.

Specifically, elastomer materials having no conductivity include: a cross-linked natural rubber, a polyisoprene rubber, and butadiene copolymer such as butadiene-styrene, butadiene-acrylonitrile, and butadiene-isobutylene, and conjugate diene rubber, and hydrogenated material thereof. Other than above, used as elastomer materials having no conductivity further include: block copolymer rubber such as styrene-butadiene-diene block copolymer rubber and styrene-isoprene block copolymer, and hydrogenated thereof. And chlorobutadiene polymer, chloroethene-polyvinyl copolymer, urethane rubber, polyester rubber, epichlorohydrin rubber, ethene-propylene copolymer rubber, ethene-propylene-diene copolymer rubber, flexible liquid epoxy rubber, silicone rubber or fluorine rubber are also used.

Among these material, silicone rubber, which is superior in heat-resistance, cold-resistance, chemical-resistance, weather-resistance, electrical isolation and safety, is preferably used.

Members formed of conductive elastomer or non-conductive elastomer may be coupled with a coupling agent to compose a dielectric sheet. A coupling agent coupling members formed of conductive elastomer and non-conductive elastomer may not be particularly limited to any bonding agent so long as bonding these members and any commercially available adhesives may be used. Specifically, coupling agent such as such as silane, aluminum, and titanate, and silane coupling agent is preferably used.

In the dielectric sheet according to the present invention, two electrodes are opposingly disposed adjacent to the first penetrating region having a high permittivity, and voltage is given between two electrodes for the dielectric sheet to serve as a solid capacitor.

The shape of first penetrating region may be identical with the opposing shape of the electrode, or may be different from the opposing shape of the electrode. It is preferable, however, that the first penetrating region is of an identical shape with the opposing shape of the electrode. An appropriate determination of size and thickness of the first penetrating region and the contents of high dielectric particle therein (i.e., high permittivity) is equal to a provision of a capacitor having a desired capacitance to a sheet-shaped elastomer connector.

The aforementioned electrode should not be particularly provided, but instead, may be replaced with land pattern on the non-mounted surface (pattern surface) in printing boards. A disposition of the first penetrating region between the land patterns in the printing board is equal to a provision of a desired capacitor to the elastomer connector.

In the present invention comprising the first penetrating region having high permittivity intersperses in the non-conductive sheet-shaped elastomer.

In the statement "the first penetrating region intersperses" means that the first penetrating region is spread out over the region, but does not necessarily mean that they are disposed disarray. The first penetrating region may be formed either disarray or with regularity in a sheet-shaped elastomer which is a dielectric sheet body. The statement "intersperses disarray" means that the region is dispersed to be distributed with no regularity, however it means not only that the first penetrating region is formed disarray without predetermined disposition, but also that the first penetrating region is suitably arranged at a predetermined disposition in a sheet-shaped elastomer with no regularity.

As described above, the first penetrating region in this invention serves as a capacitor and can determine a desired capacitance according to the area and composition of the first penetrating region. The dielectric sheet can be used, for example, as an elastomer connector. A printing board is disposed between the sheet-typed elastomer connectors to adjust the disposition of the first penetrating region to the disposition of the land pattern of the printing board, thereby complementing the circuit of the printing board.

The present invention is characterized in that the first penetrating region having high permittivity is arranged on the non-conductive sheet-shaped elastomer with regularity.

The statement "arrangement with regularity" means a form of appropriate disposition in which a penetrating region is formed in a predetermined position. As a specific example of the arrangement with regularity, the first penetrating region that is formed in a circular or rectangular shape can be arranged in a grid pattern. The grid-shape may be in a shape of rectangular or rhombic. Alternatively, circular or rectangular shaped first penetrating region may be arranged at regular intervals in a single row. The first penetrating region may be arranged concentrically. Such plurality of the first penetrating regions may either be serial capacitors or parallel capacitors.

If the arrangement pitch in the first penetrating region is to be adjusted to the land pattern arrangement of the printing board, it can be considered that the first penetrating region may be arranged at regular intervals of $1/10$ inches or 2.54 mm.

Inner leads, outer leads, or pads on IC chips have narrow arrangement pitch, or fine pitch. In order to adjust to such fine pitch, the arrangement pitch of the first penetrating region is preferably about 70 micro-meters or less.

The dielectric sheet according to the present invention comprises at least one first penetrating region having high permittivity and at least one second penetrating region having conductivity, formed respectively in the non-conductive sheet-shaped elastomer.

The term "Second penetrating region having conductivity" described above means a region composed of elastomer having conductivity, and a region penetrating from the front surface through the back surface of the sheet-shaped elastomer that composes dielectric sheet body. The member composing the second penetrating region may be an elastomer having conductivity in itself, an elastomer made to have conductivity by pressure welding, or an anisotropic conductivity elastomer having conductivity only in one direction. Elastomer having conductivity may generally be obtained by mixing elastomer having no conductivity in order to keep the volume specific resistance low (1 ohm cm ($\Omega$·cm) or less, for example) with elastomer having conductivity.

As for elastomer materials having no conductivity, the elastomer materials having no conductivity that composes of sheet-shaped elastomer having conductivity can be employed. Among these elastomer materials having no conductivity, silicone rubber, which is superior in heat-resistance, cold-resistance, chemical-resistance, weather-resistance, electrical isolation and safety, is preferably used.

Conductive elastomer is composed of mixing conductive materials such as pure metals, alloys, or non-metallic powder (also available in forms of flakes, pieces, foils, etc.) with elastomer materials having no conductivity. Pure metals may include gold, silver, copper, nickel, tungsten, platinum, and palladium. Other metals may include SUS, phosphor bronze, and beryllium copper. Non-metallic powder may be carbon powders, which may include carbon nanotube and fullerene.

Corresponding with the selection of the conductive material or mixing ratio of the conductive material into elastomer, the volume specific resistance of the second penetrating region having conductivity can appropriately be determined.

The statement "at least one first penetrating region and at least one second penetrating region being respectively formed" may means, based upon the assumption that the first penetrating region serves as a capacitor and the second penetrating region serves as a signal line, that a smoothing circuit is composed of. Smoothing circuit generally uses a signal line (also generally described as a resistance having inner resistance) and a capacitor.

Smoothing circuits are widely used in electrical circuits and electronic circuits as a use of rectifier circuits for alternating current or shaping circuits for distorted wave.

As described above, the dielectric sheet according to the present invention serves as a smoothing circuit, and can determine a desired capacitance according to the area and composition of the first penetrating region. Additionally, corresponding with the area of second penetrating region, selection of the conductive material or mixing ratio of the conductive material into elastomer, the resistance can appropriately be determined.

The dielectric sheet disposes the printing board therebetween, and the arrangement of the first penetrating region and second penetrating region is adjusted to the land pattern arrangement of the printing board, thereby complementing the smoothing circuit to the printing board.

The dielectric sheet according to the present invention comprising that a same number of first penetrating region having high permittivity and second penetrating region having conductivity, respectively, are formed therein.

In this case, it is only necessary that a same number of the first penetrating region and second penetrating region are formed on a dielectric sheet, irrespective of the form of their arrangement. In other words, the first penetrating region and second penetrating region may be arranged adjacent to or away from each other. Alternatively, the first penetrating regions are arranged adjacent to or away from each other, or similarly, the second penetrating regions are arranged adjacent to or away from each other.

In addition, individual value of electrical property of a plurality of first penetrating regions or a plurality of second penetrating regions may not necessarily be identical. According to the object of complementing a smoothing circuit in the printing board disposed between the dielectric sheets, a plurality of smoothing circuits having different property values can be circuit formed on the dielectric sheet.

The dielectric sheet according to the present invention comprising that the first penetrating region having high permittivity and the second penetrating region having conductivity are formed in pairs in the non-conductive sheet-shaped elastomer.

The statement "the first penetrating region and the second penetrating region are formed in pairs" means that a number of formation of the first penetrating region and a number of formation of the second penetrating region are identical, and on top of that, the first penetrating region and the second penetrating region are formed in such a way that they are adjacent to each other in pairs, and a plurality of smoothing circuits are formed in the sheet-shaped elastomer.

A plurality of smoothing circuits having identical property values may be formed in the sheet-shaped elastomer, or a plurality of smoothing circuits having different property values may be formed in the sheet-shaped elastomer, and their arrangement may be appropriately determined.

The dielectric sheet according to the present invention comprising that the first penetrating region having high permittivity and the second penetrating region having conductivity, respectively, are interspersed in the non-conductive sheet-shaped elastomer.

The statement "the first penetrating region and the second penetrating region, respectively, are interspersed" does not necessarily mean that the first penetrating region and the second penetrating region are interspersed with no regularity, but the first penetrating region and the second penetrating region may also be appropriately arranged with regularity in the sheet-shaped elastomer.

Additionally, the first penetrating region and the second penetrating region may be of an identical number or may be of different number, as long as a plurality of the first penetrating regions and the second penetrating regions are respectively formed in the sheet-shaped elastomer.

Moreover, the first penetrating region and the second penetrating region may or may not be formed in pairs. In other words, the first penetrating region and the second penetrating region may be arranged close with or may be arranged distanced with each other in pairs. Alternatively, the first penetrating regions are arranged adjacent to or away from each other, or similarly, the second penetrating regions are arranged adjacent to or away from each other.

In addition, individual value of electrical property of a plurality of first penetrating regions or a plurality of second penetrating regions may not necessarily be identical. According to the object of complementing a smoothing circuit in the printing board disposed between the dielectric sheets, a plurality of electrical elements having different property values can be circuit formed on the dielectric sheet. This can provide greater degree of freedom of the circuit designing. For example, π-circuit having an increased number of stages of capacitor and resistance in the smoothing circuit will also be available.

Further, in the present invention, the first penetrating region having high permittivity may comprise ferroelectrics.

Typical materials as ferroelectrics include aforementioned perovskite oxide. It may be preferable, however, that barium titanate (BaTiO3), employed in solid capacitors for the purpose of making use of its high permittivity, may be included in the elastomer as ferroelectrics. It is also preferable that the outside of the first penetrating region, that is, the sheet-shaped elastomer, and the second penetrating region may not include barium titanate (BaTiO3).

Applications of the present invention include the dielectric sheet connected to pairs of electronic parts. "Pairs of electronic parts" means electronic parts that are made in pairs. More specifically, it means parts that sandwiches a dielectric sheet therebetween. Such electronic parts include printing boards or fine pitch electronic parts (for example, semiconductor integrated circuit). The electronic parts to be made in pairs may be of identical types or different types of electronic parts such as printing boards and semiconductor integrated circuits.

DESCRIPTION OF THE PREFERRED EMBODIMENTS

Referring to drawings, a description shall now be provided hereinafter in detail of an exemplary embodiment of the invention. The exemplary embodiment is given only as a preferred example of the invention, therefore, it should be noted that the present invention shall not be limited to the embodiment described here. Where several embodiments are shown hereinafter, where like elements have been given like numerical designations, and explanation thereof may be omitted or simplified.

Figure 1:
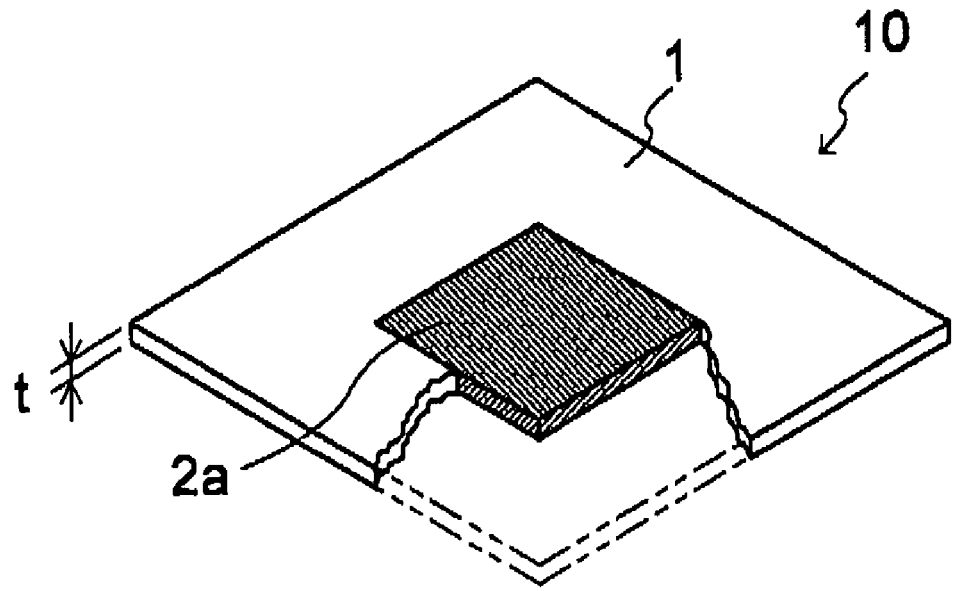
FIG. 1A is a drawing showing an appearance of a dielectric sheet according to one embodiment of the present invention.
FIG. 1B is a drawing showing an appearance of a dielectric sheet according to another embodiment of the present invention.
Figure 1:
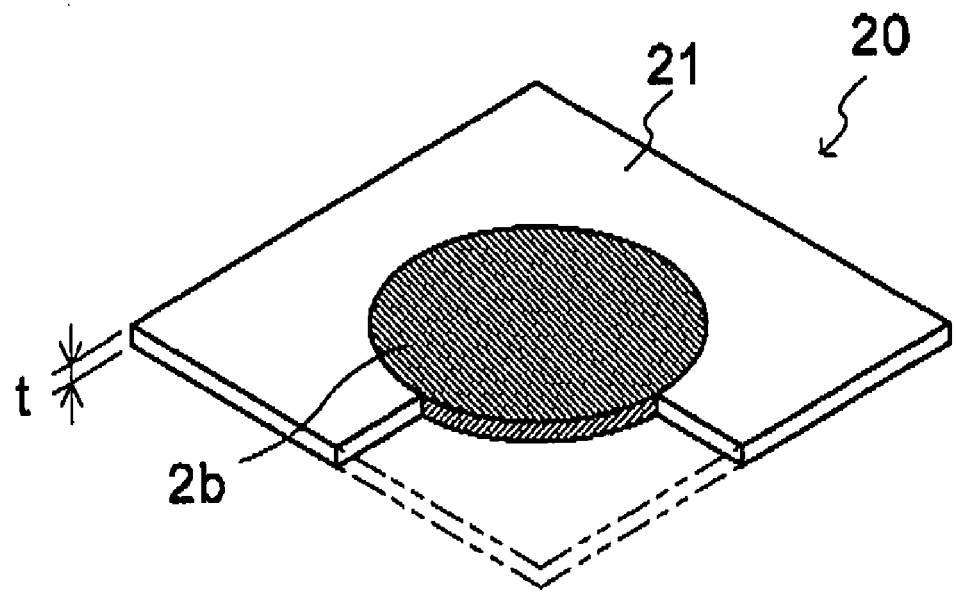

FIG. 1A is an appearance diagram of a dielectric sheet 10 according to a first embodiment of the present invention. The dielectric sheet 10 according to the embodiment of the present invention is a rectangular-shaped sheet, comprising first penetrating region 2a having high permittivity formed in a shape of rectangular in a non-conductive sheet-shaped elastomer. The sheet-shaped elastomer 1 is composed of a silicone rubber, for example.

FIG. 1B is an appearance diagram of a dielectric sheet 20 according to a second embodiment of the present invention, wherein a first penetrating region 2b having high permittivity is formed in a circular shape in a sheet-shaped elastomer 21.

In the first and second embodiments, the first penetrating region having circular and rectangular shapes, respectively are shown, however, the first penetrating region may be in any other shape as desired. It may be, for example, a polygonal or elliptical shape, or any other closed and curved surface.

The first penetrating regions 2a and 2b comprises a ferroelectric member containing ferroelectric material (barium titanate, (BaTiO3), for example) particles in a non-conductive elastomer material that comprises sheet-shaped elastomer 1 and 21. Specifically, the first penetrating regions 2a and 2b use a silicone rubber mixed with barium titanate particles.

As one example of a manufacturing method of the aforementioned dielectric sheets 10 and 20, a mold cavity corresponding to a shape of the first penetrating regions 2a or 2b is stamped through a sheet-shaped elastomer 1 or 21, a member formed as a ferroelectric member is then inserted into the obtained cavity to form the first penetrating region 2a or 2b. The first penetrating region 2a or 2b inserted respectively as a molding member is bonded with sheet-shaped elastomer 1 or 21 respectively by a coupling agent. The sheet-shaped elastomer 1 and the first penetrating region 2a has an identical thickness, and the sheet-shaped elastomer 20 and the first penetrating region 2b has an identical thickness.

In the above embodiment, a silicone rubber manufactured by Mitsubishi Plastics, Inc. or Shin-Etsu Polymer Co., Ltd is employed, and a silane coupling agent manufactured by Shin-Etsu Polymer Co., Ltd is employed as a coupling agent.

It may be understood that the dielectric sheets 10 and 20 corresponds to a sheet being characterized in that the conductive material in the anisotropic conductive sheet type elastomer connector is replaced with the ferroelectric first penetrating regions 2a or 2b.

Whereas it is an object of the anisotropic conductive sheet type elastomer connector to obtain electric conductivity between the electronic parts, it is an object of the dielectric sheets 10 and 20 to interconnect between the electronic parts through the dielectric material.

The connection of one printing board to another printing board through the dielectric sheet 10, for example, provides the other printing board with solid capacitor through the first penetrating region 2a. The dielectric sheet 10 thus serves to complement the circuit of electronic parts to be connected.

As is well known, the capacitance C [F] of the solid capacitor is determined by permittivity $\in$ (epsilon) [F/m], distance d [m] of insulator (dielectric material), and area A [m$^2$] of the insulator (dielectric material). The capacitance C may be obtained by the equation: $C = \in (epsilon) \times (A/d)$.

Assuming that the first penetrating region 2a of the dielectric sheet 10 is a solid capacitor, the thickness t of the dielectric sheet 10 is equivalent to the distance d of the insulator (dielectric material) and the area of the first penetrating region 2a is equivalent to the area A of the insulator (dielectric material). The characteristic value of permittivity $\in$ (epsilon) is determined by a mixing ratio of barium titanate into the silicone rubber in the ferroelectrics member forming the first penetrating region 2.

A plate thickness, area or a mixing ratio of barium titanate into the silicone rubber is therefore accordingly determined to form a solid capacitor having desired capacitance in the dielectric sheet 10.

Figure 2:
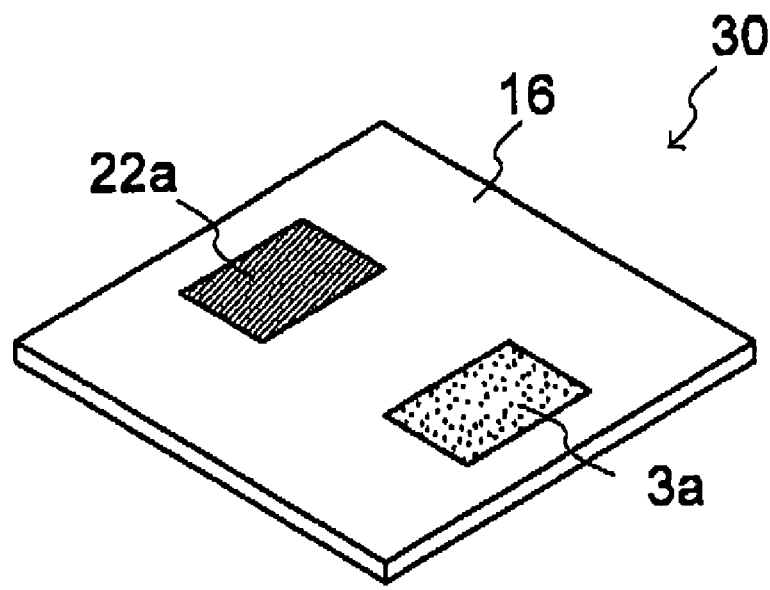
FIG. 2A is a drawing showing an appearance of a dielectric sheet according to the present invention showing a modified example of the second penetrating region having conductivity further formed on the dielectric sheet shown in FIG. 1A.
FIG. 2B is a drawing showing an appearance of a dielectric sheet according to the present invention showing a modified example of the second penetrating region having conductivity further formed on the dielectric sheet shown in FIG. 2A.
Figure 2:
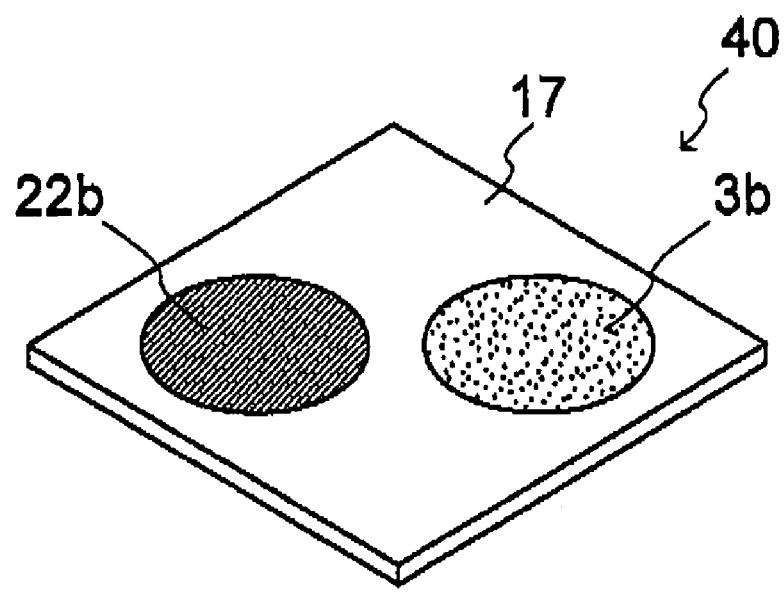

FIG. 2A is an outline view of a dielectric sheet 30 showing a modified example of the second penetrating region 3a having conductivity further formed on the dielectric sheet 10 shown in FIG. 1A. The dielectric sheet 30 according to the present invention is a rectangular-shaped sheet comprising a rectangular first penetrating region 22a having high permittivity in the non-conductive sheet-shaped elastomer 16, and it further comprises a second penetrating region 3a having conductivity formed in rectangular shape. The sheet-shaped elastomer 16 is composed of silicone rubber, for example.

FIG. 2B is a modified example of dielectric sheet 20 shown in FIG. 1B, wherein a sheet-shaped elastomer 17 comprises a first penetrating region 22b having high permittivity formed in a circular shape. Similarly, a sheet-shaped elastomer 17 comprises a second penetrating region 3b having conductivity formed in a circular shape.

In the embodiment in FIGS. 2A and 2B, circular and rectangular shaped second penetrating regions having conductivity are illustrated, however, the second penetrating region may be of any other shape as desired. It may be, for example, polygonal or elliptical shape, or any other closed and curved surface.

Also, in the dielectric sheet 30 and 40, the first penetrating regions 22a and 22b having high permittivity, and the second penetrating regions 3a and 3b having conductivity are formed in an identical shape respectively, however, the first penetrating regions and the second penetrating regions may be formed in different shapes respectively.

In the dielectric sheet 30, for example, the rectangular shaped first penetrating region and circular shaped second penetrating region may be arranged, or in the dielectric sheet 40, circular shaped first penetrating region and rectangular shaped second penetrating region may be arranged.

It can be considered that the second penetrating regions 3a and 3b having conductivity are formed of conductive elastomer, which is obtained by mixing non-conductive material such as a silicone rubber with conductive material in order to keep the volume specific resistance low (not exceeding 1 Ω·cm, for example).

As one example of a manufacturing method of the aforementioned dielectric sheets 30 and 40, a mold cavity corresponding to a shape of the second penetrating regions 3a or 3b is stamped through a sheet-shaped elastomer 16 or 17, a member formed as a conductivity member is then inserted into the obtained cavity to form the second penetrating region 3a or 3b. The second penetrating regions 3a or 3b inserted respectively as a molding member is bonded with sheet-shaped elastomer 16 or 17 respectively by a coupling agent. The sheet-shaped elastomer 16, the first penetrating region 22a, and the second penetrating region 3a have an identical thickness, and the sheet-shaped elastomer 17 and the second penetrating region 3b has an identical thickness.

Non-conductive elastomer and coupling agent used in the dielectric sheets 10 and 20 are also used here.

The dielectric sheets 30 or 40 shown in FIG. 2A or 2B is identical with the dielectric sheet 10 or 20 shown in FIGS. 1A and 1B except that further comprises second penetrating regions 3a or 3b having conductivity.

The second penetrating region 3a or 3b of the dielectric sheets 30 or 40 according to the present invention may be used as a conductive material of the elastomer connector, however, the resistance value of the conductive material provided in known elastomer connectors of anisotropic conductive sheet type is determined to a degree that is low enough to keep the elasticity property of the portion. On the other hand, the resistance value of the second penetrating region 3a or 3b of the dielectric sheets 30 or 40 according to the present invention is determined to a degree that is high enough to keep the elasticity property of the region.

In brief, the second penetrating region 3a or 3b is formed in a way that it can be used as a resister in the electrical circuit. The characteristic value of resistance value of the second penetrating region 3a or 3b is determined by a volume of the second penetrating region 3a or 3b, types of conductivity materials mixed in the silicone rubber composing the second penetrating region 3a or 3b, and a mixing ratio of conductivity materials.

A plate thickness and area of the second penetrating region 3a or 3b, or type or mixing ratio of conductivity materials mixed in the silicone rubber is therefore accordingly determined to provide the dielectric sheet 30 or 40 with a solid resistance of desired resistance value.

The dielectric sheet 30 can be provided with a so-called smoothing circuit by using the first penetrating region 2a as a solid capacitor, adjusting the resistant value of the second penetrating region 3a, and providing a desired solid resistance with the dielectric sheet 30.

For example, when one printing board is connected to other printing board through the dielectric sheet 30 and accordingly wired to one of the printing board, it provides the other printing board with the smoothing circuit. The dielectric sheet 30 thus serves to complement the smoothing circuit to the circuit of electronic parts to be connected.

The following description refers a dielectric sheet that comprises the first penetrating region having high permittivity and the second penetrating region having conductivity as a "smoothing circuit sheet", which is distinguished from a "dielectric sheet" that only comprises the first penetrating region having high permittivity. These two terms will be completely distinguished in the following description unless otherwise required.

The dielectric sheet or smoothing circuit sheet according to the present invention thus serves to complement the circuit of electronic parts to be connected. It can be considered that a plurality of first penetrating regions having high permittivity or a plurality of second penetrating regions having conductivity may be formed in the dielectric sheet or smoothing circuit sheet.

Figure 3:
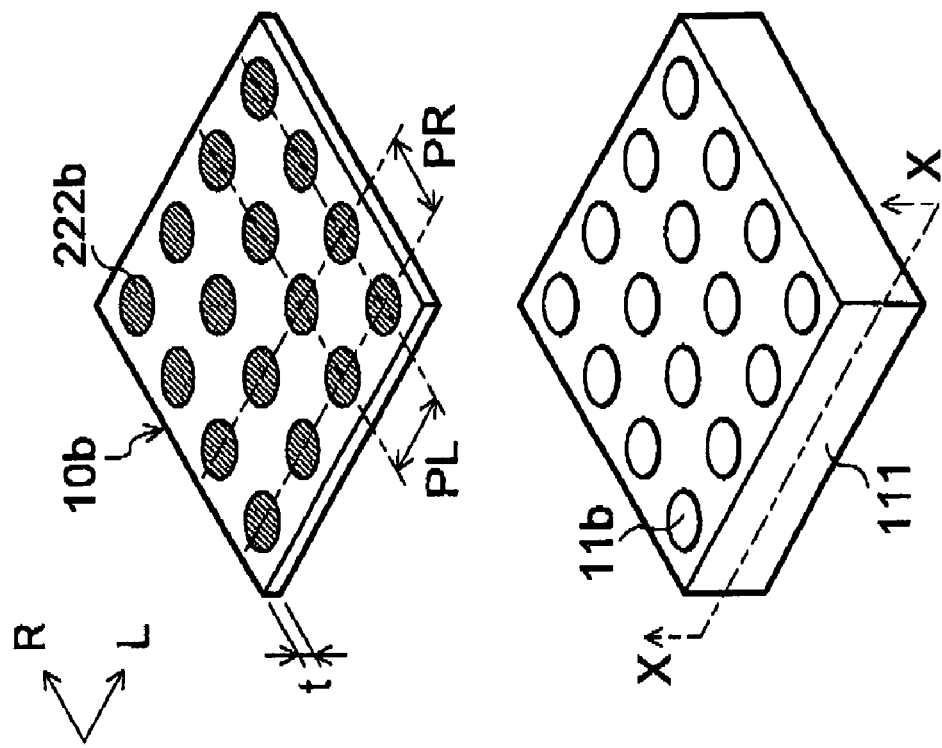
FIG. 3A is a drawing illustrating a manufacturing method of a dielectric sheet forming a plurality of rectangular-shaped first penetrating regions.
FIG. 3B is a drawing illustrating a manufacturing method of a dielectric sheet forming a plurality of circular-shaped first penetrating regions.
Figure 3:
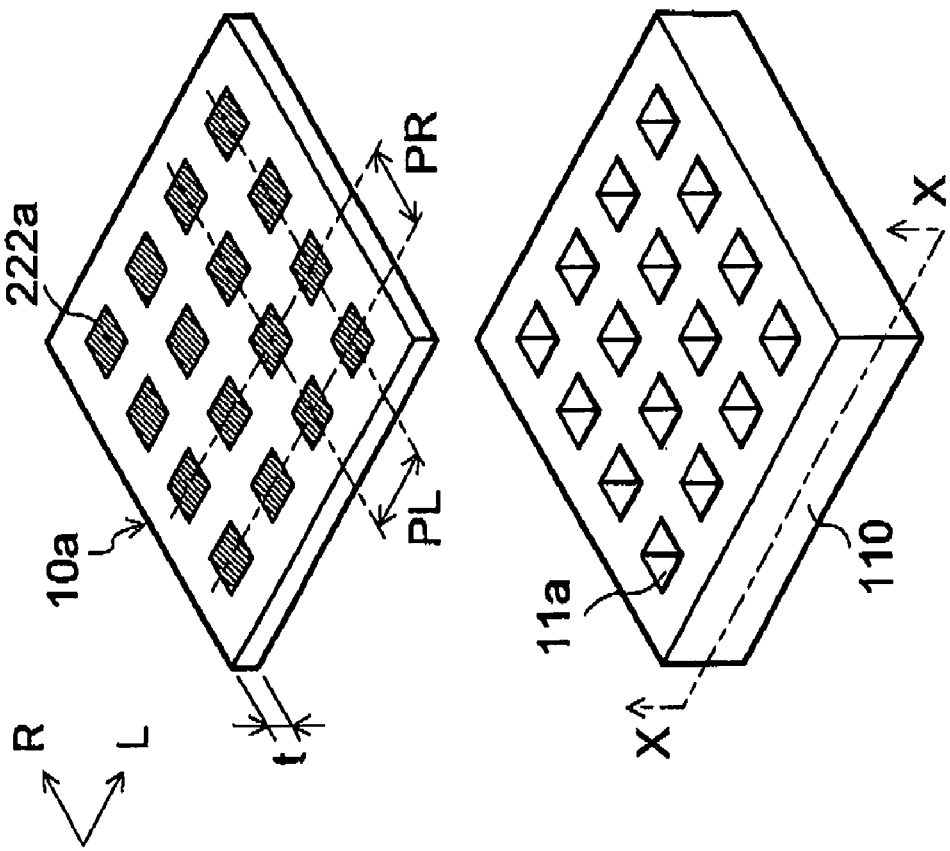

FIGS. 3A and 3b shows a dielectric sheet having a plurality of first penetrating regions having high permittivity and a method for manufacturing the same. In FIGS. 3A and 3b, an arrow L represents a line direction (transverse thickness direction) and an arrow R represents a row direction (longitudinal thickness direction)

As shown in FIG. 3A, a plurality of rectangular-shaped penetrating holes 11a are formed in longitudinal and crosswise directions (in line and row directions) in a non-conductive cubic block 110 molded of non-conductive elastomer. Similarly, as shown in FIG. 3B, a plurality of circular-shaped penetrating holes 11b are formed in longitudinal and crosswise directions (in line and row directions) in a non-conductive cubic block 111 molded of non-conductive elastomer.

Vulcanized ferroelectric elastomer having a shape corresponding to the rectangular-shaped penetrating holes 11a or circular-shaped penetrating holes 11b are inserted to the rectangular-shaped penetrating holes 11a or circular-shaped penetrating holes 11b, respectively.

The non-conductive block 110 and 111 are not vulcanized. However, the vulcanized ferroelectric elastomer and non-vulcanized non-conductive block can be bonded together by inserting the vulcanized ferroelectric elastomer into the penetrating holes 11a or 11b, and then heating the non-vulcanized non-conductive block 110 and 111.

For this reason, the coupling agent is not necessarily provided in the above manufacturing method, but may be optionally provided or may even be deleted from the process.

Non-conductive block 110 is cut-off to a predetermined thickness t through a line X-X to obtain a rectangular shaped dielectric sheet 10a having a thickness t. In the dielectric sheet 10a, a plurality of rectangular shaped first penetrating regions 222a are formed in longitudinal and crosswise directions. Similarly, non-conductive block 111 is cut-off in a predetermined thickness t through a line X-X to obtain a rectangular shaped dielectric sheet 10b having a thickness t. In the dielectric sheet 10b, a plurality of circular shaped first penetrating regions 222b is formed in longitudinal and crosswise directions.

Non-conductive block 110 and 111 may be cut by using blades such as super-steel cutters and ceramic cutters, by grinders such as fine cutters, by saws, or by other machining devices or cutting apparatus (including non-contact type cutting apparatus such as laser cutters).

In addition, in a process of cutting, machining fluid such as machining oil can be used or dry-cutting methods may be adopted in order to prevent overheating, to obtain smooth cutting surface, or to satisfy any other purposes.

In this way, the conventionally difficult creation of dielectric sheet of which thin sheet-shaped elastomer is the main body and the creation of dielectric sheet of which thick sheet-shaped elastomer is the main body can be facilitated. The thickness of dielectric sheets are generally approximately 1 mm, or can be approximately 100 nm or less when thin sheet is required, or can even be approximately 50 nm or less when thinner sheet is particularly desired, or can reversely be made to several mm. In the present embodiment, the thickness is approximately 1 mm.

The pitch PL in a line direction L and the pitch PR in a row direction R of the first penetrating region 222a and 222b having high permittivity can be determined arbitrarily. The first penetrating region can be arranged in regular intervals of ⅒ inches or 2.54 mm when pitches PL and PR are adjusted in the land pattern arrangement of the printing board. The pitch PL and PR is preferably 70 micrometers or less when adjusted to the fine pitch of IC.

Figure 4:
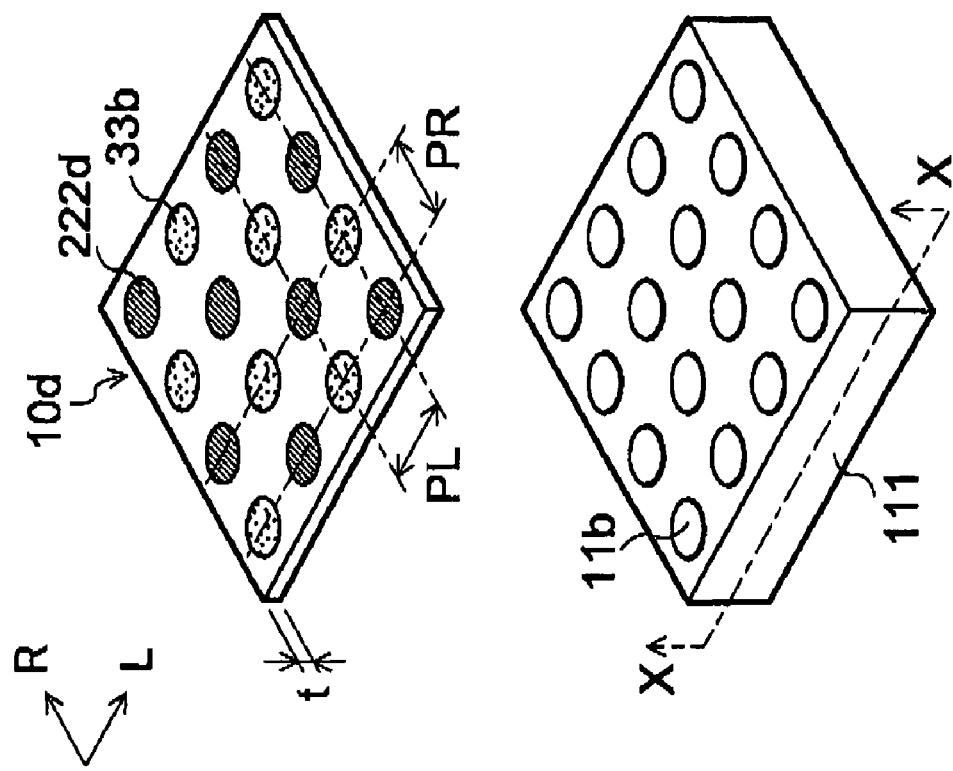
FIG. 4A is a drawing illustrating a manufacturing method of a smoothing circuit sheet in which a plurality of rectangular-shaped first penetrating regions and second penetrating regions are formed respectively.
FIG. 4B is a drawing illustrating a manufacturing method of a smoothing circuit sheet in which a plurality of circular-shaped first penetrating regions and second penetrating regions are formed respectively.
Figure 4:
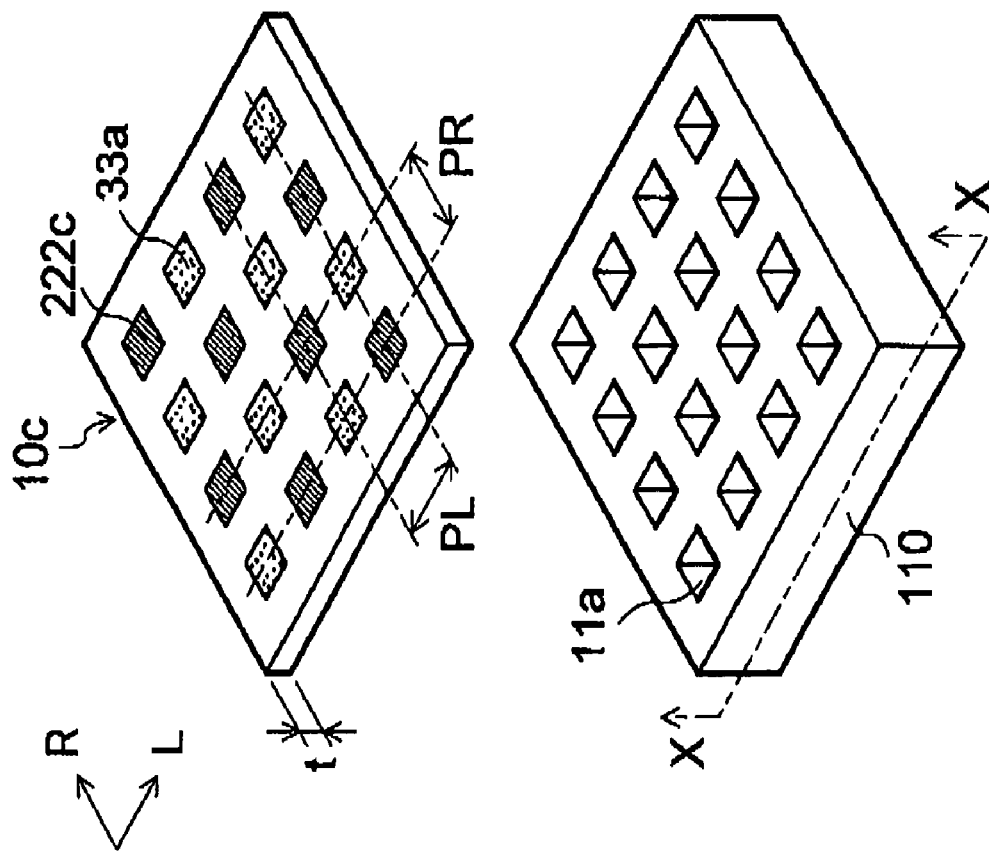

FIGS. 4A and 4b shows a manufacturing method of smoothing circuit sheet that is a type of dielectric sheet comprising a plurality of first penetrating regions having high permittivity and second penetrating regions having conductivity respectively.

As shown in FIG. 4A, a plurality of rectangular-shaped penetrating holes 11a are formed in longitudinal and crosswise directions in a non-conductive cubic block 110 molded of non-conductive elastomer. Similarly, as shown in FIG. 4B, a plurality of circular-shaped penetrating holes 11b are formed in longitudinal and crosswise directions in a non-conductive cubic block 111 molded of non-conductive elastomer.

Vulcanized ferroelectric elastomer having a shape corresponding to the rectangular-shaped penetrating holes 11a and vulcanized conductive elastomer are inserted alternatively into the rectangular-shaped penetrating holes 11a.

Similarly, vulcanized ferroelectric elastomer having a shape corresponding to the rectangular-shaped penetrating holes 11b and vulcanized conductive elastomer are alternatively inserted into the circular-shaped penetrating holes 11b.

The non-conductive block 110 having rectangular-shaped penetrating holes 11a and the non-conductive block 111 having circular-shaped penetrating holes 11b are heated to bond the vulcanized ferroelectric elastomer and the vulcanized conductive elastomer.

Non-conductive block 110 is cut-off to a thickness t through a line X-X to obtain a smoothing circuit sheet 10c having a thickness t. In the smoothing circuit sheet 10c, a plurality of rectangular shaped first penetrating regions 222c having high permittivity, and a plurality of rectangular shaped second penetrating regions 33a having conductivity are alternatively formed in longitudinal and crosswise directions.

Similarly, non-conductive block 111 is cut-off to a thickness t through a line X-X to obtain a smoothing circuit sheet 10d having a thickness t. In the smoothing circuit sheet 10d, a plurality of circular shaped first penetrating regions 222d having high permittivity, and a plurality of circular shaped second penetrating regions 33b having conductivity are alternatively formed in longitudinal and crosswise directions.

The non-conductive blocks 110 and 111 may be cut off in a similar way described in aforementioned manufacturing process of dielectric sheet 10a and 10b.

This facilitates preparation of smoothing circuit sheet having various thicknesses, in spite of difficulties generally existing in preparation of thin smoothing circuit sheets. The thickness of smoothing circuit sheet are generally approximately 1 mm, or can be approximately 100 nm or less when thin sheet is required, (or can even be approximately 50 nm or less when thinner sheet is particularly desired), or can reversely be made to several mm. In the present embodiment, the thickness is approximately 1 mm.

The pitch PL in a line direction L and the pitch PR in a row direction R of the first penetrating region 222c and 222d having high permittivity and second penetrating region 33a and 33b having conductivity can be determined arbitrarily. It can be considered that each penetrating region be arranged in a regular intervals of 1/10 inches or 2.54 mm when pitches PL and PR are adjusted in the land pattern arrangement of the printing board. The pitch PL and PR is preferably 70 micrometers or less when adjusted to the fine pitch of IC.

FIGS. 5 to 8 illustrate other processes for manufacturing dielectric sheets having similar shape as dielectric sheet 10a shown in FIG. 3A.

Figure 5:
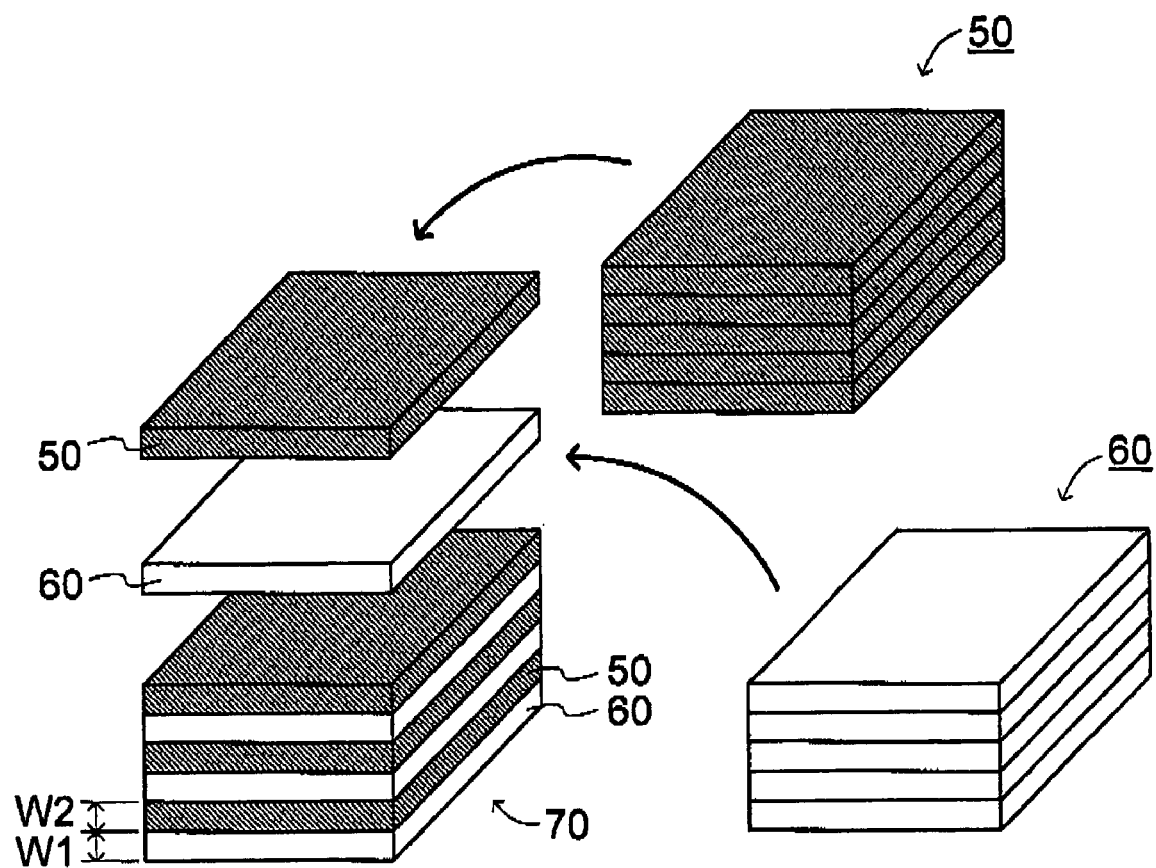
FIG. 5 shows a process for laminating dielectric sheet members and non-conductive sheet members in relation to a method for manufacturing a dielectric sheet according to the present invention.

FIG. 5 shows a process for forming a sheet member laminating block 70, in which a plurality of dielectric sheet members 50 that are plate shaped elastomer having high permittivity, and a plurality of non-conductive sheet members 60 that are plate shaped non-conductive elastomer are prepared, and the dielectric sheet members 50 and the non-conductive sheet members 60 are alternatively laminated with one another.

The dielectric sheet members 50 and non-conductive sheet members 60 are provided with a coupling agent therebetween for coupling of each sheet members. The thickness of non-conductive sheet member 60 is shown as W1 and the thickness of dielectric sheet member 50 is shown as W2.

The non-conductive sheet member 60 is arranged at the very bottom of the sheet member laminating block 70. It may be considered that the thickness W1 of non-conductive sheet member 60 is equivalent to the distance between adjacent first penetrating regions 222a in the dielectric sheet 10a shown in FIG. 3A. It may also be considered that the thickness W2 of dielectric sheet member 50 laminated on the non-conductive sheet member 60 is equivalent to the length of one side (herein referred to as a "transverse thickness direction") of first penetrating regions 222a in the dielectric sheet 10a shown in FIG. 3A. The thickness of dielectric sheet member or non-conductive sheet member can be changed to adjust the space intervals and size of the first penetrating region, thereby achieving a fine pitch required in the highly integrated circuit etc.

The alternative lamination of the dielectric sheet members and non-conductive sheet members may also include alternative lamination in which two or more dielectric sheet members are laminated continuously and then one or more non-conductive sheet members are laminated thereon. Or it may also include alternative lamination in which two or more non-conductive sheet members are laminated continuously and then one or more dielectric sheet members are laminated thereon.

Figure 6:
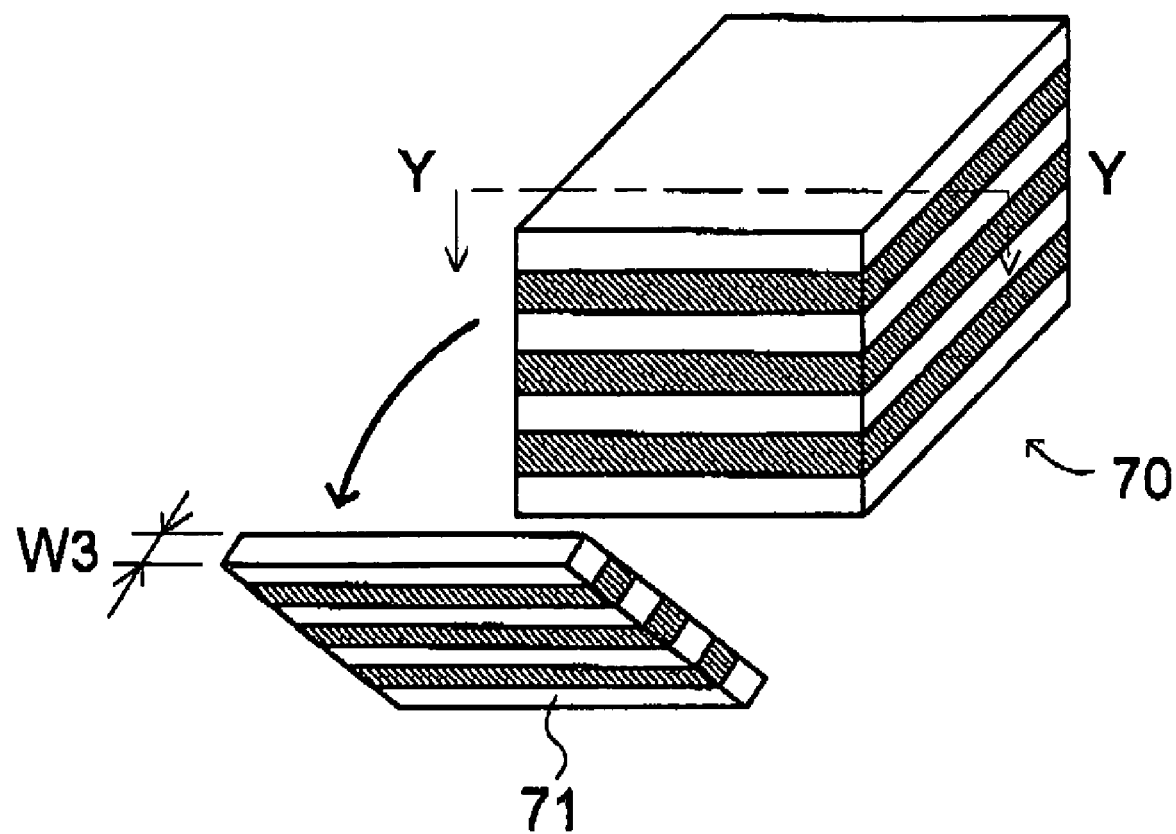
FIG. 6 shows a process for cutting the laminated block prepared by lamination as illustrated in FIG. 5.

FIG. 6 a shows a process for cutting off the sheet member laminating block 70 prepared by aforementioned sheet member laminating process. The sheet member laminating block 70 is cut through a line Y-Y with a thickness W3 to obtain a striped sheet member 71. The thickness W3 of the striped sheet member 71 is equivalent to a length of one side perpendicular to the transverse thickness direction (referred to as a "longitudinal thickness direction") of the first penetrating region 222a in the dielectric sheet 10a.

Figure 7:
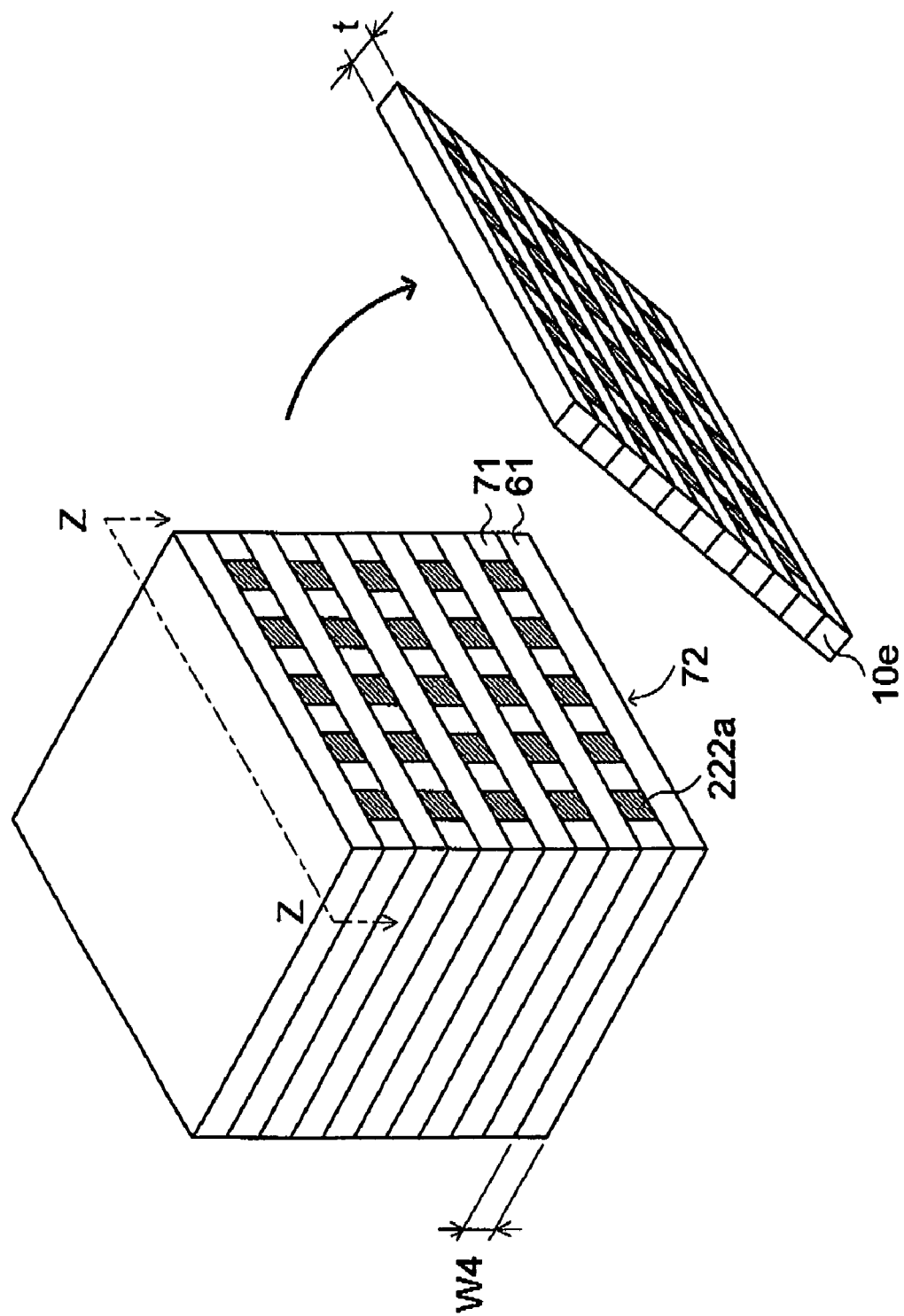
FIG. 7 illustrates a process for laminating a non-conductive sheet member and a striped sheet member having been cut off in FIG. 6.
Figure 8:
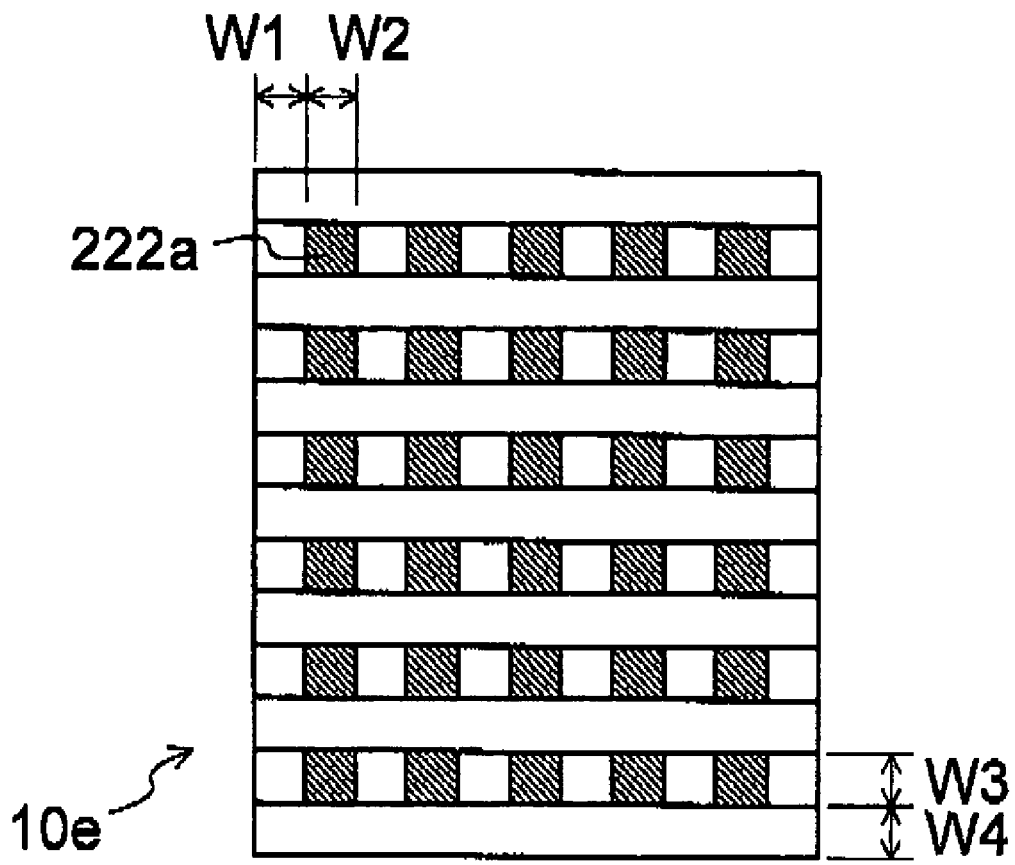
FIG. 8A is a plan view of a dielectric sheet obtained in the processes shown in FIGS. 5 to 7.
FIG. 8B is a transverse cross-sectional view of the dielectric sheet shown in FIG. 8A.
Figure 8:
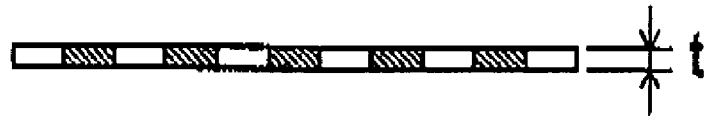

FIG. 7 shows a dielectric sheet block 72 formed by alternatively laminating the striped sheet members 71 obtained from the above cutting process of the sheet member laminating block and plate-shaped non-conductive sheet members 61. The figure also shows the dielectric sheet block 72 being cut in a predetermined width.

The non-conductive sheet member 61 has an identical length of transverse width and longitudinal width as the striped sheet member 71 does, and is alternatively laminated with the striped sheet member 71. These sheet members are provided with a coupling agent therebetween for coupling of each sheet members.

The thickness W4 of the non-conductive sheet member 61 is arbitrarily determined, however, may be considered as equivalent to the adjacent distance between the first penetrating regions 222a and the dielectric sheet 10a shown in FIG. 3A, and therefore determining the pitch PL and PR of the first penetrating regions 222a according to the thickness W3 and W4 of the non-conductive sheet member 60 and 61.

The resultant dielectric sheet block 72 is cut-off with a thickness t through a line Z-Z to obtain a dielectric sheet 10e.

FIG. 8A is a plan view of a dielectric sheet obtained from the process shown in above, and FIG. 8B is a transverse cross-sectional view of the dielectric sheet shown in FIG. 8A. As shown in FIG. 8A, a plurality of first penetrating regions 222a having high permittivity is in a rectangular shape and has a transverse thickness in a length of W2 and a longitudinal thickness in a length of W3, and arranged in longitudinal and crosswise directions of the dielectric sheet 10e with regularities.

As shown in FIG. 8A, a plurality of first penetrating regions 222a may be interspersed in the dielectric sheet 10e. The values of W1 to W4 are arbitrarily determined. The dielectric sheet 10e in FIG. 8A is in the identical shape to that of the dielectric sheet 10a in FIG. 3A, however, the dielectric sheet 10e is formed by laminating sheet-shaped elastomer of non-conductive material, whereas the sheet-shaped elastomer which is non-conductive material of the dielectric sheet 10a in FIG. 3A is integrally molded.

FIGS. 9 to 12 show processes for manufacturing a smoothing circuit sheet in other manufacturing methods. The figures show a smoothing circuit sheet having the identical shape to that of the smoothing circuit sheet 10c shown in FIG. 4A, the smoothing circuit sheet 10c comprising a plurality of first penetrating regions having high permittivity and a plurality of second penetrating regions having conductivity.

Figure 9:
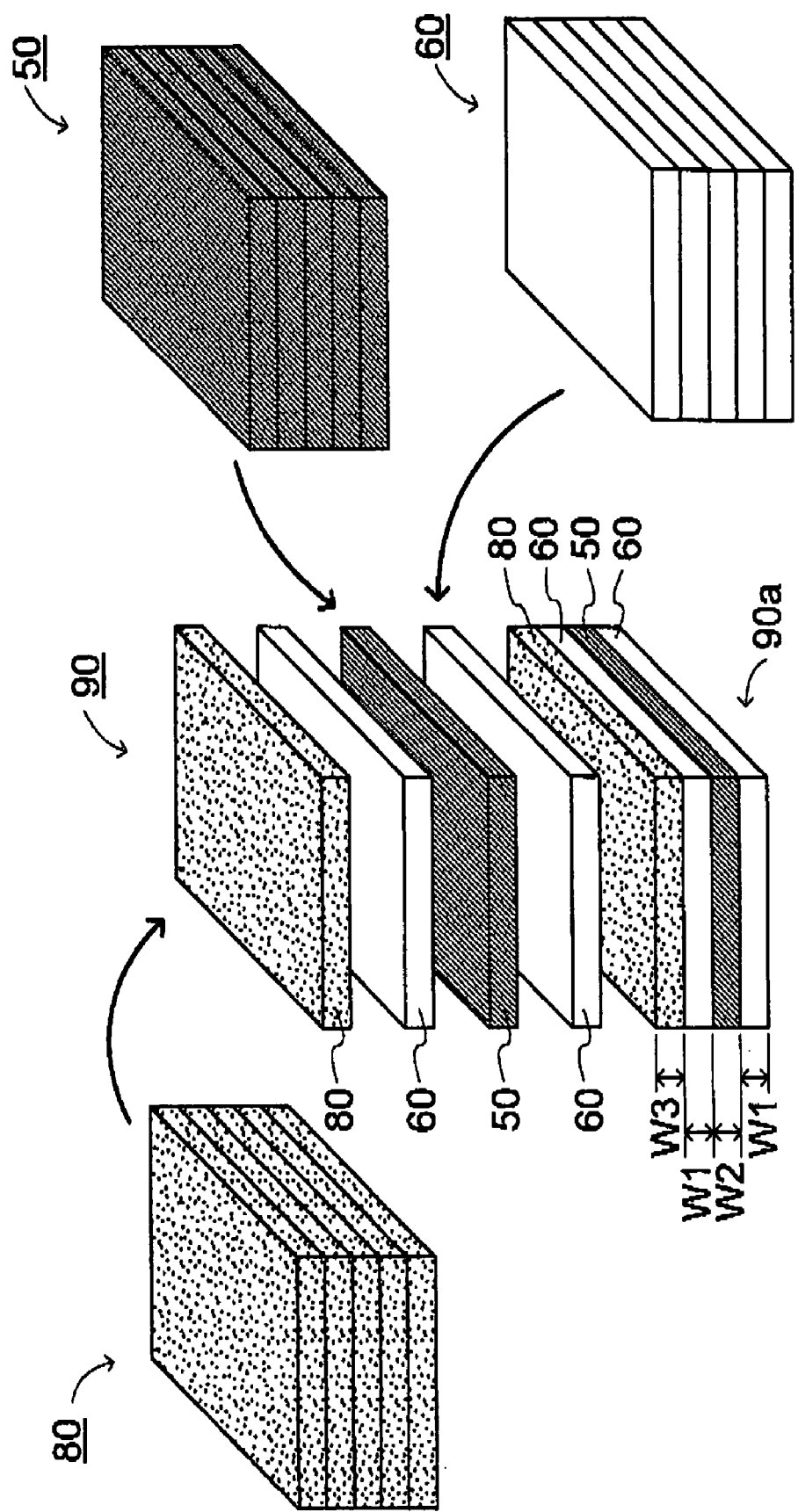
FIG. 9 illustrates a process for laminating dielectric sheet members, non-conductive sheet members, and conductivity sheet members in relation to a manufacturing method of a smoothing circuit sheet according to the present invention.

FIG. 9 shows how a sheet member laminating block 90 is formed by laminating sequently a plurality of dielectric sheet members 50, non-conductive sheet members 60, and conductive sheet members 80 of a plate-shaped elastomer having conductivity in a predetermined combination thereof.

In the sheet member laminating block 90, the non-conductive sheet member 60 is arranged in the very bottom, and the dielectric sheet member 50 is arranged thereon. Following the arrangement is the non-conductive sheet member 60, and then conductive sheet member 80. The sequence continues. These sheet members are provided with a coupling agent therebetween for coupling of respective sheet members. The thickness of non-conductive sheet member 60 is shown as W1, the thickness of dielectric sheet member 50 is shown as W2, and the thickness of conductive sheet member 80 is shown as W3.

In FIG. 9, the dielectric sheet member 50 and conductive sheet member 80 are sandwiched by two non-conductive sheet members 60. The non-conductive sheet members 60 may be of two or more layers, or the dielectric sheet member 50 and conductive sheet member 80, respectively, are also of two or more layers.

A plurality of layers of the dielectric sheet members 50, non-conductive sheet members 80, and conductive sheet members 80 are laminated and bonded to form the sheet member laminating block 90. A part of which, a block 90a, may be bonded to a block 90a which has similar structure to form the sheet member laminating block 90. Or a plurality of sheet members may sequentially be laminated and bonded to form the sheet member laminating block 90.

In FIG. 9, it may be considered that the thickness W1 of the non-conductive sheet member 60 is equivalent to the distance between the adjacent first penetrating region 222c and second penetrating region 33a. It may also be considered that the thickness W2 of the dielectric sheet member 50 is equivalent to one side ("transverse thickness") of the first penetrating region 222c shown in FIG. 4A, and similarly, the thickness W3 of the conductive sheet member 80 is equivalent to one side ("transverse thickness") of the second penetrating region 33a.

Figure 10:
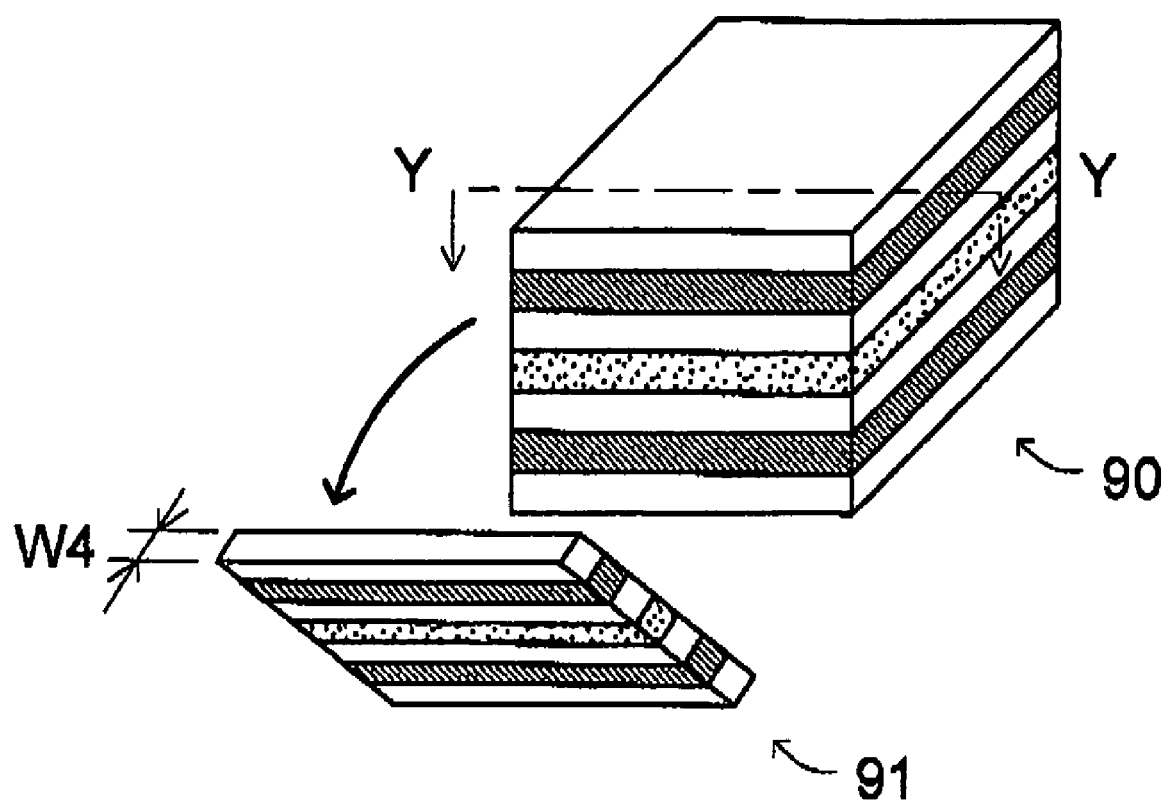
FIG. 10 shows a process for cutting off the laminated block prepared by lamination as illustrated in FIG. 9.

In FIG. 10, the sheet member laminating block 90 formed by the aforementioned sheet member laminating process is cut. The sheet member laminating block 90 is cut with a thickness of W4 along a line Y-Y to obtain a striped sheet member 91. The thickness W4 of the striped sheet member 91 is equivalent to the length of one side perpendicular to the thickness ("longitudinal thickness") of the first penetrating region 222c and second penetrating region 3a in FIG. 4A.

Figure 11:
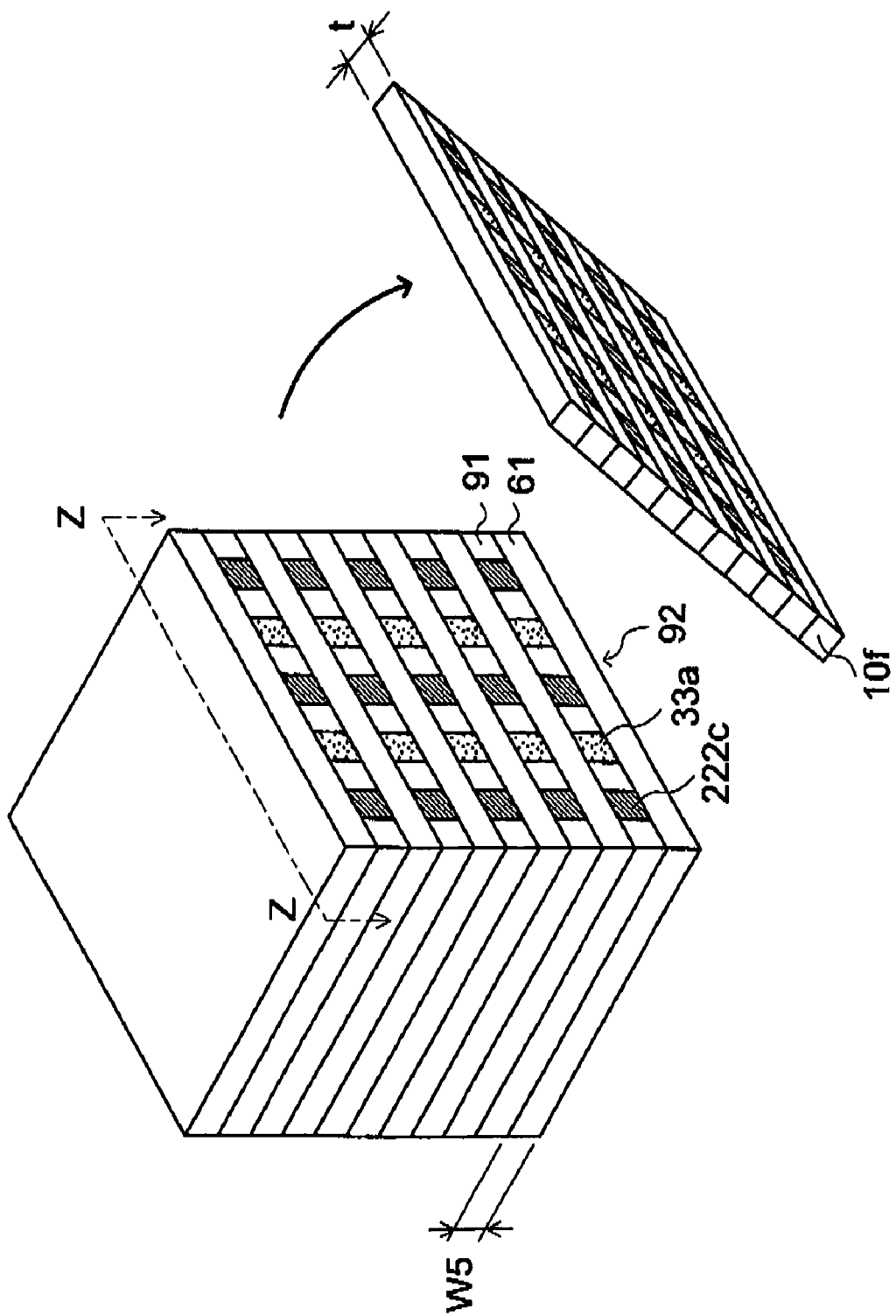
FIG. 11 illustrates a process for laminating a non-conductive sheet member and the striped sheet member cut off as shown in FIG. 10.
Figure 12:
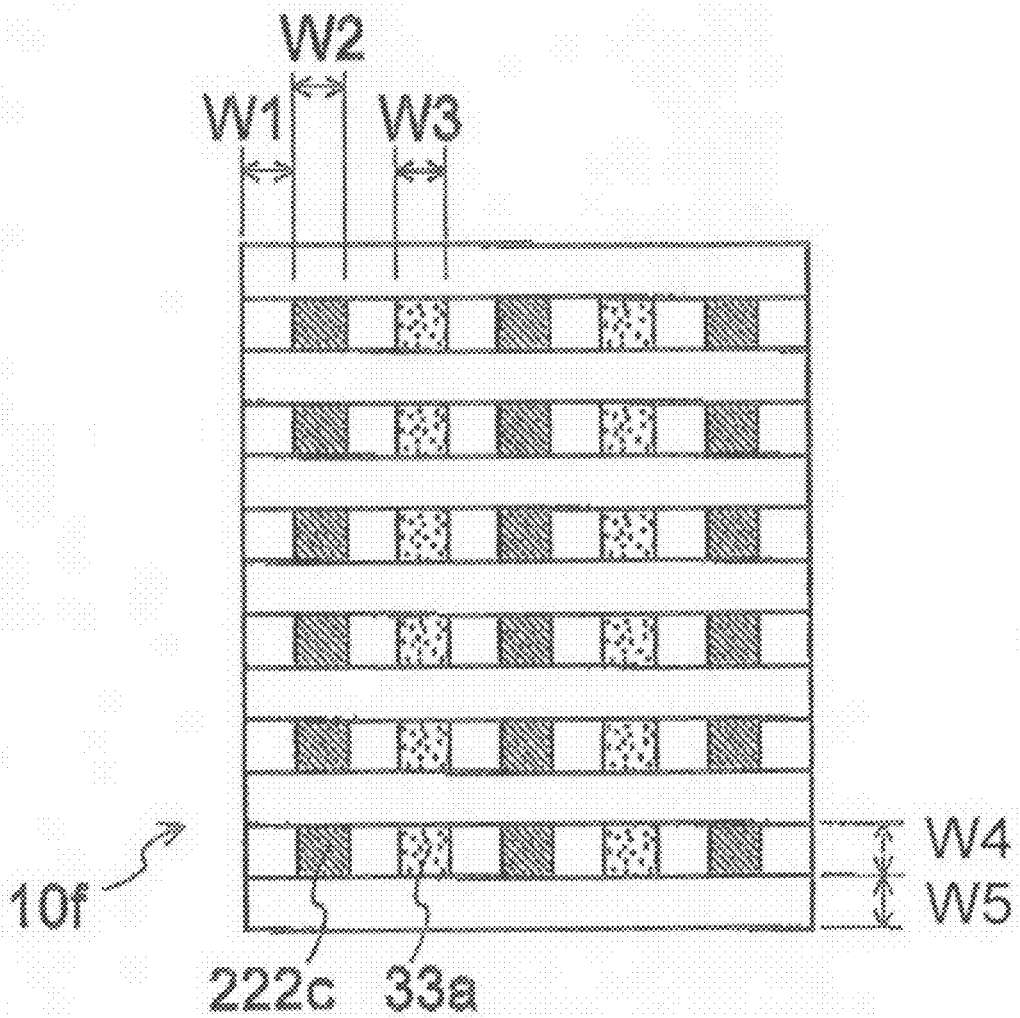
FIG. 12A is a plan view of a smoothing circuit sheet obtained in the processes shown in FIGS. 9 to 11.
FIG. 12B is a transverse cross-sectional view of the smoothing circuit sheet shown in FIG. 12A.
Figure 12:
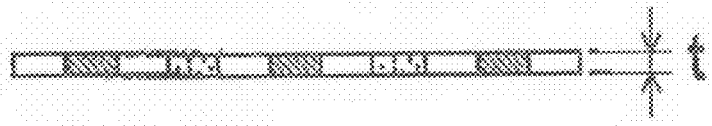

In FIG. 11, the striped sheet member 91 obtained from a cutting process of aforementioned sheet member laminating block 90 and non-conductive sheet member 61 are alternatively laminated to form a smoothing circuit sheet block 92. The figure also shows the smoothing circuit sheet block 92 being cut in a predetermined thickness.

The non-conductive sheet member 61, having an identical thickness and length with the striped sheet member 91, is laminated alternatively with the striped sheet member 91. These sheets are provided with a coupling agent therebetween for coupling of each sheet members.

The thickness W5 of the non-conductive sheet member 61 is arbitrarily determined, however, may be considered as equivalent to the adjacent distance between the first penetrating regions 222c and second penetrating region 33a shown in FIG. 4A, and therefore determining the pitch PL and PR of the first penetrating regions 222c having high permittivity and second penetrating region 33a having conductivity according to the thickness W4 and W5 of the non-conductive sheet member 60 and 61.

The resultant smoothing circuit sheet block 92 is cut-off with a thickness t through a line Z-Z to obtain a smoothing circuit sheet 10f.

FIG. 12A is a plan view of a smoothing circuit sheet 10f obtained from the process shown above and FIG. 12B is a transverse cross-sectional view of the smoothing circuit sheet shown in FIG. 12A. As shown in FIG. 12A, a plurality of first penetrating regions 222c having high permittivity is in a rectangular shape and has a transverse thickness W2 and a longitudinal thickness W5, and arranged in longitudinal and crosswise directions of the dielectric sheet 10f with regularities. Similarly, a plurality of second penetrating regions 33a having conductivity is in a rectangular shape and have a transverse thickness W3 and a longitudinal thickness W5, and arranged in longitudinal and crosswise directions of the smoothing circuit sheet 10f with regularities.

As shown in FIG. 12A, a same number of the first penetrating regions 222c having high permittivity and the second penetrating regions 33a having conductivity, respectively, are formed in the smoothing circuit sheet 10f are formed in pairs. In addition, the first penetrating regions 222c having high permittivity and the second penetrating regions 33a having conductivity may be formed in pairs and adjacent to each other in the smoothing circuit sheet as shown in FIG. 12A. Alternatively, the first penetrating regions having high permittivity and the second penetrating regions having conductivity may be interspersed with no regularity in the smoothing circuit sheet.

The smoothing circuit sheet 10f in FIG. 12A has almost identical structure to that of the dielectric sheet 10c in FIG. 4A, however, the smoothing circuit sheet 10f is formed by laminating sheet-shaped elastomer of non-conductive material, whereas the sheet-shaped elastomer which is non-conductive material of the dielectric sheet 10c is integrally molded.

The dielectric sheet according to the present invention can thus have the effect of complementing circuits in the electronic parts to be connected to the dielectric sheet, by having the capacitor or electrical element of the resister being incorporated as elastomer, while ensuring the electrical insulating property and elasticity in the surface direction.

In addition, the area and pitch of the first penetrating region having high permittivity and second penetrating region having conductivity can be freely determined, and the fine pitches desired in the highly integrated dielectric sheet are easily achieved. The non-conductive member in the first penetrating region and second penetrating region are chemically bonded (cross-linked by rubber) and no conductive portion of wire metal is adopted, thus there is no trouble of missing and lacking of the conductive portion.

In the dielectric sheet according to the present invention, as described above, the first penetrating region having high permittivity is formed in the non-conductive sheet-shaped elastomer, or the first penetrating region and the second penetrating region having conductivity, respectively, is formed in the non-conductive sheet-shaped elastomer. This can provide greater degree of freedom of the circuit designing of the electronic parts to be connected to the dielectric sheet. In addition, the dielectric sheet can correspond to smaller and thinner electronic parts to be connected to the dielectric sheet. One or plurality of penetrating region(s) may be provided with the dielectric sheet.

What is claimed is:

1. A dielectric sheet used as an elastomer connector comprising:
   a non-conductive sheet-shaped elastomer;
   first penetrating regions having high permittivity, each of which is arranged in the non-conductive sheet-shaped elastomer at a first predetermined pitch in a first direction;
   second penetrating regions having conductivity, each of which is arranged in the non-conductive sheet-shaped elastomer at the first predetermined pitch in the first direction;
   wherein the first penetrating regions and the second penetrating regions are alternately arranged at a second predetermined pitch in a second direction orthogonal to the first direction,
   wherein the first predetermined pitch is defined by associating a thickness of the non-conductive sheet-shaped elastomer in the first direction in which the first penetrating regions and the second penetrating regions are not formed, with a thickness in the first direction included by both the first penetrating regions and the second penetrating regions, and
   wherein the second predetermined pitch is defined by associating a thickness of the non-conductive sheet-shaped elastomer in the second direction in which the first penetrating regions and the second penetrating regions are not formed, with a thickness of the first penetrating regions in the second direction and a thickness of the second penetrating regions in the second direction.

2. The dielectric filheet according to claim 1,
   wherein the non-conductive sheet-shaped elastomer includes a plurality of non-conductive sheet members,
   the first penetrating regions include a plurality of dielectric sheet members,
   the second penetrating regions include a plurality of conductive sheet members, and
   wherein each of the non-conductive sheet members, the dielectric sheet members and the conductive sheet members are provided with a coupling agent therebetween for coupling of each sheet member.

3. The dielectric sheet according to claim 2,
   wherein each thickness of the non-conductive sheet-shaped elastomer in the first and second direction is based on a thickness of the conductive sheet members,
   wherein the thickness of the first penetrating regions in the second direction is based on a thickness of each of the dielectric sheet members, and
   wherein the thickness of the second penetrating regions in the second direction is based on a thickness of each of the conductive sheet members.

4. The dielectric sheet according to claim 1,
   wherein said at least one first penetrating region having high permittivity includes ferroelectrics,
   wherein the ferroelectrics include in a shape of a piece, particle, flake, or powder at least one material selected from the group consisting of barium titanate ($BaTiO_3$) as a perovskite oxide, lead titanate ($PbTiO_3$), lithium niobate ($LiNbO_3$) and lithium tantalite ($LiTaO_3$).

5. A pair of electronic parts characterized in that the pair of electronic parts are connected with each other by the dielectric sheet according to claim 1.

6. The dielectric sheet according to claim 2, wherein said at least one first penetrating region having high permittivity is arranged with regularity in the non-conductive sheet-shaped elastomer.

7. The dielectric sheet according to claim 2, further comprising:
   at least one second penetrating region having conductivity being formed in the non-conductive sheet-shaped elastomer.

8. The dielectric sheet according to claim 3, further comprising:
   at least one second penetrating region having conductivity being formed in the non-conductive sheet-shaped elastomer.

9. The dielectric sheet according to claim 7, wherein a same number of said at least one first penetrating region having high permittivity and said at least one second penetrating region having conductivity are formed in the non-conductive sheet-shaped elastomer.

10. The dielectric sheet according to claim 8, wherein a same number of said at least one first penetrating region having high permittivity and said at least one second penetrating region having conductivity are formed in the non-conductive sheet-shaped elastomer.

11. The dielectric sheet according to claim 1, wherein said at least one first penetrating region having high permittivity and said at least one second penetrating region having conductivity are formed in pairs.

12. The dielectric sheet according to claim 7, wherein said at least one first penetrating region having high permittivity and said at least one second penetrating region having conductivity are formed in pairs.

13. The dielectric sheet according to claim 1, wherein said at least one second penetrating region having conductivity intersperses in the non-conductive sheet-shaped elastomer.

14. The dielectric sheet according to claim 1, wherein said at least one second penetrating region having conductivity intersperses in the non-conductive sheet-shaped elastomer.

15. The dielectric sheet according to claim 2, said at least one first penetrating region having high permittivity includes ferroelectrics.

16. The dielectric sheet according to claim 3, said at least one first penetrating region having high permittivity includes ferroelectrics.

* * * * *